United States Patent [19]
Michael et al.

[11] Patent Number: 5,717,242
[45] Date of Patent: Feb. 10, 1998

[54] INTEGRATED CIRCUIT HAVING LOCAL INTERCONNECT FOR REDUING SIGNAL CROSS COUPLED NOISE

[75] Inventors: Mark W. Michael, Cedar Park; Robert Dawson, Austin; Basab Bandyopadhyay, Austin; H. Jim Fulford, Jr., Austin; Fred N. Hause, Austin; William S. Brennan, Austin, all of Tex.

[73] Assignee: Advanced Micro Devices, Inc., Sunnyvale, Calif.

[21] Appl. No.: 633,473

[22] Filed: Apr. 17, 1996

[51] Int. Cl.$^6$ .................. H01L 29/76; H01L 29/94
[52] U.S. Cl. .................. 257/386; 257/295; 257/368; 257/377; 257/382; 257/383; 257/384
[58] Field of Search .................. 257/368, 377, 257/382, 383, 384, 386, 295

[56] References Cited

U.S. PATENT DOCUMENTS 4,392,150  7/1983  Courreges ............ 257/383
4,894,693  1/1990  Tigelbar et al. ........ 257/384
5,124,774  6/1992  Godinho et al. ........ 257/904

Primary Examiner—Mahshid D. Saadat
Assistant Examiner—Valencia Martin Wallace
Attorney, Agent, or Firm—Kevin L. Daffer; Conley, Rose & Tayon

[57] ABSTRACT

An integrated circuit is provided having an improved interconnect structure. The interconnect structure includes a power-coupled local interconnect which is always retained at VDD or VSS (i.e., ground) level. The local interconnect resides a dielectric-spaced distance below critical runs of overlying interconnect. The powered local interconnect serves to sink noise transients from the critical conductors to ensure that circuits connected to the conductors do not inoperably function. Accordingly, the local interconnect extends along a substantial portion of the conductor length, and is either wider or narrower than the conductor under which it extends. The local interconnect can either be polysilicon, doped polysilicon, polycide, refractory metal silicide, or multi-level refractory metal.

20 Claims, 3 Drawing Sheets

INTEGRATED CIRCUIT HAVING LOCAL INTERCONNECT FOR REDUING SIGNAL CROSS COUPLED NOISE

BACKGROUND OF THE INVENTION

1. Field of the Invention

This invention relates to semiconductor fabrication and more particularly to an integrated circuit which employs local interconnect for reducing cross coupled noise within conductors arranged above the local interconnect. The local interconnect is advantageously connected to a power supply for sinking transient noise spikes from the overlying conductors.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are covered by a dielectric material. The layers of conductors overlaid with a dielectric present a topography upon which a subsequent layer of conductors can be patterned.

Conductors are made from an electrically conductive material, a suitable material being a metal or metal silicide. Substrate includes any type of material which can retain dopant ions and the isolated conductivity regions brought about by those ions. Typically, substrate is a silicon-based material which receives p-type or n-type ions.

In order to complete the fabrication of an integrated circuit, isolated regions within the substrate and conductors spaced above the substrate must be interconnected. Wherever a connection is needed between a substrate and conductor, or between conductors on separate levels, an opening in the dielectric must be provided to allow such context to occur. Formation of openings and fabrication of ohmic materials in those openings is generally referred to as contact technology. Depending upon what is being contacted, contact technology varies. For example, contact of a polysilicon conductor to an isolated silicon region differs substantially from contact of a metal conductor to a polysilicon conductor or metal to silicon. Typically, the design rule spacing requirements are dissimilar depending upon the features being contacted.

Contact of a polysilicon conductor to underlying silicon substrate is performed simply by forming an opening in the interposed dielectric. When the polysilicon is subsequently deposited, the polysilicon forms an electrical contact with the silicon in the opening but is isolated everywhere else. The aforementioned contact structure is typically referred to as a "buried contact" because a metal conductor can cross over a dielectric-covered buried contact without making an electrical connection to it. The use of buried contacts provides an important benefit in that it makes available an additional level of interconnect on an integrated circuit.

A polysilicon conductor, as part of a buried contact, is not as universal as a metal conductor for two reasons. First, a polysilicon conductor cannot cross over regions where a transistor gate exists without making a contact to the gate. Second, polysilicon resistivity is substantially higher than that of aluminum (Al). Since metal conductors can extend in an unrestricted fashion across a semiconductor topography, metal conductors are generally referred to as global interconnects, to distinguish them from the routing-restricted interconnect of polysilicon. Thus, polysilicon conductors are distinguished from metal conductors, and are often termed "local interconnect".

There are many types of materials used to establish local interconnects. For example, local interconnects can be formed in numerous ways, some of which are (i) a refractory metal silicide upon polysilicon, (ii) a single or double-doped polysilicon, (iii) multi-layered refractory metal partially converted to silicide, and (iv) refractory metal deposited by physical vapor deposition (PVD) or chemical vapor deposition (CVD).

Local interconnects and associate buried contacts serve an important function. Primarily, local interconnects make available an additional level of interconnect on the integrated circuit. Local interconnects, when covered with a dielectric, allow global interconnect such as metal conductors to extend over the local interconnect and buried contacts. Thus, local interconnects afford an additional interconnect level provided the added resistance of a local interconnect would not deleteriously affect circuit performance. For this reason, local interconnects are generally used for short interconnect runs relative to much longer metal conductors. Local interconnects are used primarily to interconnect gates and drains in MOS circuits, and are prevalent in, for example, high density VLSI logic and SRAMs. An SRAM cell layout can be substantially reduced when a local interconnect level and associated buried contacts are used.

Referring now to FIG. 1, an exemplary SRAM cell of conventional design is shown. SRAM cell 10 includes a pair of cross-coupled transistors 12 and a pair of access transistors 14. Application of a word bit (W0 and W1) will force the output from transistors 12 to undergo a change in state when a sufficient voltage magnitude and duration of bit input (B0 or B1) exists.

A chief disadvantage of an SRAM cell is that it consists of several devices (four are shown), as compared to only two devices needed for a dynamic memory cell. Thus, even when the same set of design rules is used, an SRAM die cannot be built with as many cells as a DRAM die. As SRAMs have evolved, they have undergone an increase in density. Most of this has been due to the use of smaller line widths. However, density improvements occur when using, for example, buried contacts, local interconnects, and poly load resistors 16 in lieu of devices.

FIG. 1 illustrates an SRAM cell having four devices and two poly load resistors 16, instead of a cell having six devices. In a four-transistor cell having two poly load resistors 16, there are no P-channel devices, so no N-channel-to-P-channel isolation is needed. Furthermore, the poly load resistors 16 simply require buried contacts rather than metal contacts needed to connect N-channel and P-channel devices. Buried contacts, by definition, take less space than metal contacts.

The smaller geometry afforded by poly load resistors is principally achieved by using not only buried contacts, but associated local interconnect as well. Typically, a high density SRAM cell employs two polysilicon local interconnect levels. A first level of local interconnect is typically a metal polycide structure formed upon polysilicon, and is generally used for the VSS power line as well as the gates of MOS transistors 12. The local interconnect level is also a polycide conductor for both the high-valued load resistors 16 and the low-resistance VDD lines. From the above, it is recognized that local interconnect is advantageously used in SRAMs or in any VLSI device when short interconnect runs are needed, or where buried contact sizings prove advantageous. Conventionally, however, local interconnects are therefore used not only to connect to VSS or VDD, but when applied in an SRAM environment are also used as gate-to-drain interconnect structures. If local interconnect is coupled as a gate structure it, by definition, must take on differing operational voltage values ranging between VDD and VSS or alternating between VDD and VSS (depending upon the voltage value of B0 or B1). In the cross-coupled example, the voltage value on one local interconnect gate structure will be opposite that of the other local interconnect gate structure. In conventional applications, therefore, local interconnects must take on non-fixed operational voltage values of the functional circuit.

It would be desirable to employ local interconnect not simply as short routing runs of a multi-layered structure. An improvement might exist whereby the local interconnect is used to remove cross-coupling noise of adjacent conductors. To remove the operational noise of the conductor, an improvement is needed whereby the local interconnect is coupled to a fixed power supply voltage, and is not afforded the opportunity to transition from the power supply or between power supplies as in conventional designs. The improved design must thereby use a local interconnect for reasons dissimilar from conventional local interconnects.

SUMMARY OF THE INVENTION

Broadly speaking, the present invention contemplates an integrated circuit which employs a power-coupled local interconnect to reduce cross-coupling noise within the integrated circuit. More specifically, a local interconnect is used to sink noise from an overlying conductor through the local interconnect and into a power supply connected to the local interconnect. The improved architecture thereby employs local interconnect outside the integrated circuit operational routing—i.e., not within the normal interconnect structure of an integrated circuit. The local interconnect is directly coupled to a power supply (VDD or VSS) and is distanced from the conductors which carry operational current or voltage of an integrated circuit. Defined herein, VDD refers to a power supply above or below ground (preferably above ground at or approximately equal to 1.5 volts to 5.0 volts above ground). VSS is defined as ground voltage (e.g., 0.0 volts).

The integrated circuit thereby comprises an interconnect structure which includes a local interconnect patterned upon a semiconductor topography, or a local interconnect inlaid into a dielectric. Placed upon the local interconnect is a dielectric, and placed upon the dielectric is a metal conductor. The local interconnect is connected directly to a power supply which serves to capacitive couple any transient noise within the metal conductor through the dielectric and to power supply via the local interconnect.

The local interconnect is typically made from a conductive material having higher resistivity than aluminum, and certainly higher resistivity than the metal conductor. The local interconnect comprises either polysilicon, doped polysilicon, refractory metal/silicide, or appropriate combinations of each. The local interconnect preferably occupies a local, relatively small area of semiconductor topography generally larger in lateral dimension then the overlying metal conductor. According to an alternative embodiment, the local interconnect extends along an axis parallel to the longitudinal axis associated with the metal conductor. In the latter instance, the local interconnect extends a substantial distance along and below the metal conductor and is somewhat smaller in overall lateral area than the overlying conductor provided, however, that the local interconnect reserves an area outside the lateral area occupied by the conductor. The reserved area of local interconnect is that which extend laterally from the overlying metal conductor for receiving a contact and overlying power-coupled conductor. In either embodiment, the local interconnect is arranged directly below the longitudinal run of the metal conductor, except for the contact area occupied by the power-coupled conductor.

BRIEF DESCRIPTION OF THE DRAWINGS

Other objects and advantages of the invention will become apparent upon reading the following detailed description and upon reference to the accompanying drawings in which.

Figure 1:
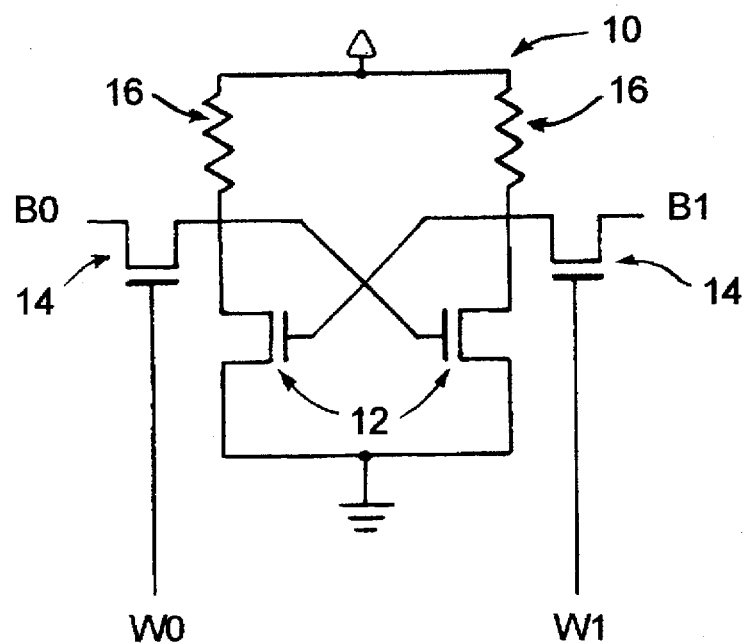
FIG. 1 is a circuit diagram of a static random access memory (SRAM) cell employing local interconnect according to a conventional design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
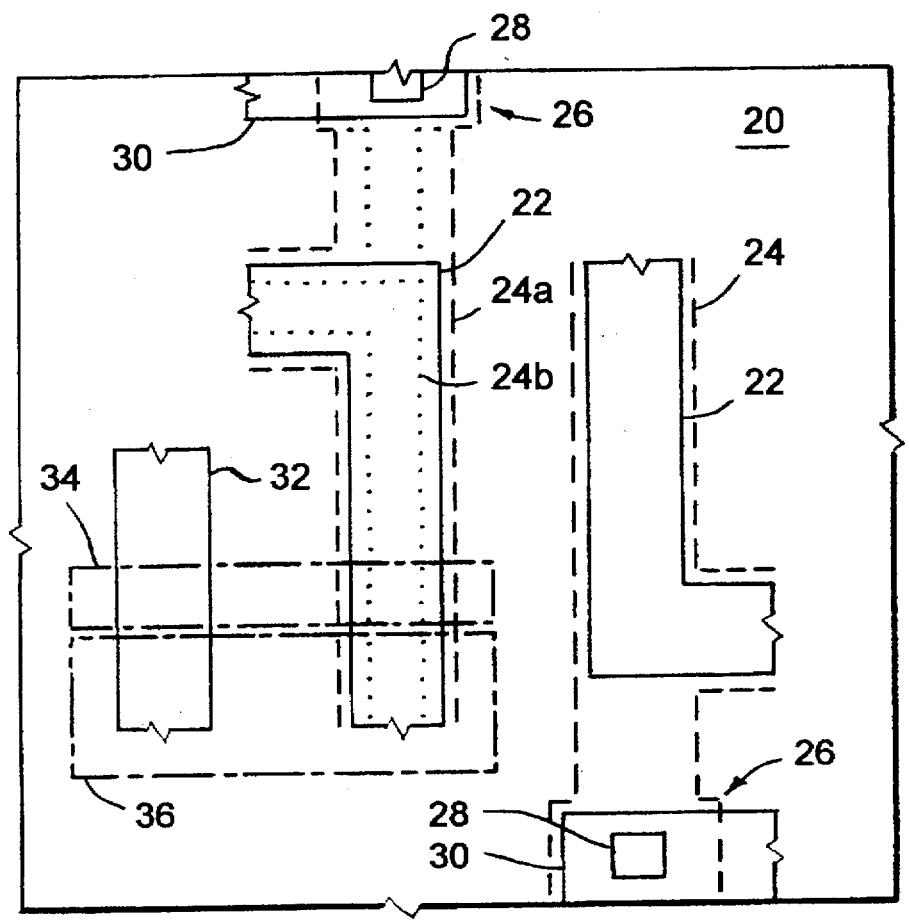
FIG. 2 is a partial, top plan view of a set of global interconnect (metal conductors) spaced over power-coupled local interconnect.

Turning now to drawings, FIG. 2 illustrates a partial, top plan view of an integrated circuit 20. Integrated circuit 20 includes a set of global interconnect, metal conductors 22, spaced over power-coupled local interconnect 24. Local interconnect 24 is defined herein above as being routing restrictive to areas outside of polysilicon gate areas or polysilicon within active areas (i.e., areas where active transistors are formed), and are of higher resistivity than conductors 24. Conductors 24 are defined as conductors made of aluminum, or aluminum silicide. Local interconnect 24 is made of any conductive material less than the conductivity of aluminum, and preferably includes polysilicon, doped polysilicon, refractory metal, refractory metal silicide, and/or a combination of multi-layer refractory metal nitrides and silicides.

FIG. 2 illustrates integrated circuit 20 as having a plurality of metal conductors 22, wherein selected conductors 22 reside a dielectric-spaced distance above local interconnect 24. FIG. 2 also illustrates the varying size of local interconnect 24. Illustrated by reference numerals 24a and 24b, local interconnect 24a is shown as being wider than overlying conductor 22, and extends along the entire longitudinal axis of conductor 22. Conversely, local interconnect 24b is shown of lesser width than conductor 22. Regardless of its configuration, local interconnect 24 preferably extends a substantial length of conductor 22, and protrudes laterally from underneath conductor 22 to a contact region 26. Contact region 26 is defined as a region exclusive of conductor 22. Region 26 is sized so as to receive a contact 28 and an overlying power-coupled conductor 30. Conductors 30, 22, region 26 and contact 28 obey minimum spacing rules applicable to MOS circuit implementations.

FIG. 2 further depicts a conductor 32 having no associated local interconnect 24. Local interconnect 24 is thereby used only below "critical" conductors 22. Critical conductors 22 are defined as those which require transient noise spike suppression afforded by a closely spaced, powered local interconnect. Integrated circuit 20 further includes active and field regions 34 and 36, respectively. Regions 34 and 36 reside a dielectric spaced distance below the conductors as well as below local interconnect 24. Active regions 34 serve to receive devices, and field regions 36 serve to isolate devices.

Referring to FIGS. 3–6, various embodiments are shown by which local interconnect 24 are formed. FIGS. 3–6 are shown along plane A of FIG. 2, in accordance with a processing sequence necessary to form various types of local interconnect structures.

Figure 3:
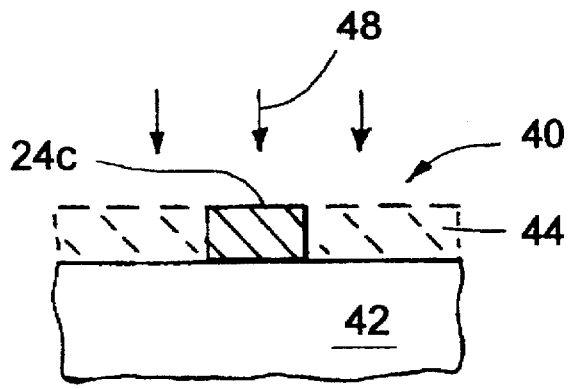
FIG. 3 is a processing step shown along plane A of FIG. 2, wherein a single-doped or dual-doped polysilicon local interconnect is formed according to one exemplary embodiment.
Figure 4:
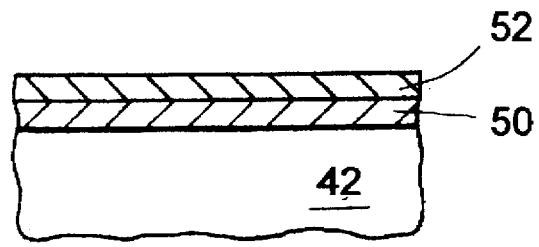
FIG. 4a is a processing step shown along plane A of FIG. 2, wherein a dual layer of refractory metal is formed according to another exemplary embodiment.
FIG. 4b is a processing step subsequent to that shown in FIG. 4a, wherein an upper layer of the dual layer is selectively removed and a temperature cycle is applied to the remaining layers.
FIG. 4c is a processing step subsequent to that shown in FIG. 4b, wherein the layers unaffected by the temperature cycle are removed to form a refractory metal silicide local interconnect.
Figure 4:
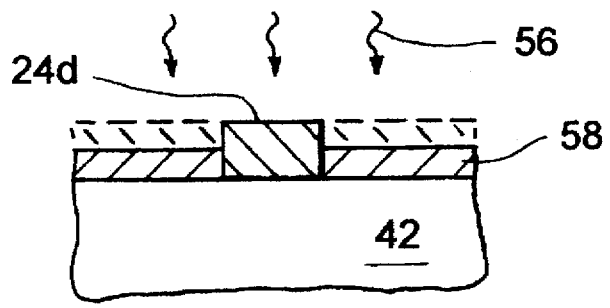
Figure 4:
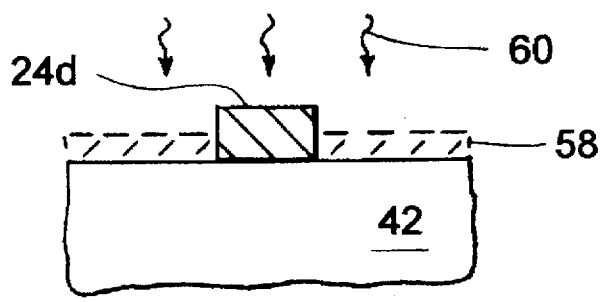

FIG. 3 depicts polysilicon 40 deposited across semiconductor topography 42. Polysilicon layer 40 is thereafter selectively removed using lithography techniques. The removed regions are shown by dashed lines, and are designated as reference numeral 44. Regions between removed areas 44, or retained polysilicon, are designated as local interconnect 24c. Local interconnect 24c, as shown according to one embodiment, has a polysilicon layer previously implanted with either a single or dual set of dopants. For example, polysilicon 40 can be deposited with an n-type ion (for an NMOS process) or both n-type and p-type ions (for a CMOS process). The dopant ions are directed in accordance with arrows 48.

FIG. 4a illustrates, according to an alternative embodiment, a layer of refractory metal 50, such as titanium (Ti) is deposited upon topography 42, followed by deposition of amorphous silicon 52. FIG. 4b illustrates, in a subsequent processing step, selective removal of amorphous silicon 52. The etch material is chosen to remove silicon, but is not sensitive to removal of underlying refractory metal. The thickness of refractory metal and amorphous silicon is chosen such that the amorphous silicon will react fully with the underlying refractory metal during a subsequent processing step in which a thermal cycle 56 is applied. Thermal cycle 56 causes the retained silicon to react with underlying refractory metal, to form local interconnect 24d. The unreacted refractory metal 58 is thereafter removed, as shown by FIG. 4c. Removal of the unreacted refractory metal is carried forth using a wet etch solution comprising, for example, $H_2SO_4$ and $H_2O_2$. A final, higher temperature anneal cycle is then applied, as shown by reference numeral 60. The higher temperature anneal is used to reduce the resistivity of the ensuing refractory metal silicide of local interconnect 24d.

Figure 5:
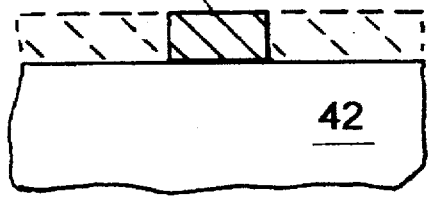
FIG. 5 is a processing step shown along plane A of FIG. 2, wherein dual layer of refractory metal local interconnect is formed according to yet another exemplary embodiment.

FIG. 5 illustrates an alternative formation of local interconnect. According to this embodiment, local interconnect 24e is formed by depositing two separate levels of refractory metal, suitable refractory metal includes titanium followed by tungsten (W). Alternatively, titanium and tungsten can be simultaneously deposited from a single sputter target. The titanium and tungsten layer is then selectively removed, and in regions where the layer is retained, a local interconnect 24e is formed.

Figure 6A:
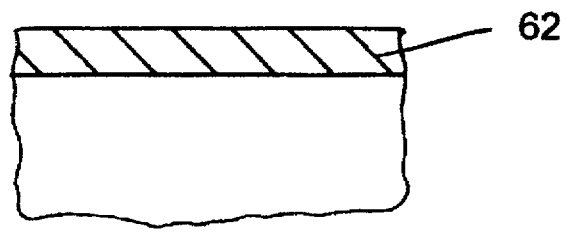
FIG. 6a is a processing step shown along plane A of FIG. 2, wherein a single layer of refractory metal is formed according to still another exemplary embodiment.
Figure 6B:
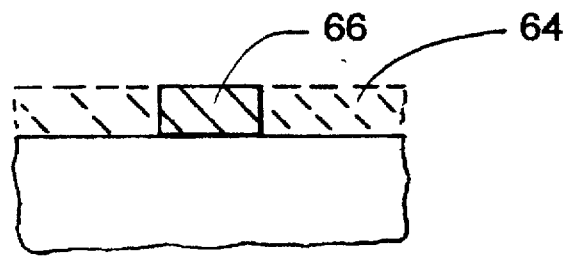
FIG. 6b is a processing step subsequent to that shown in FIG. 6a, wherein the single layer of refractory metal is selectively removed.
Figure 6C:
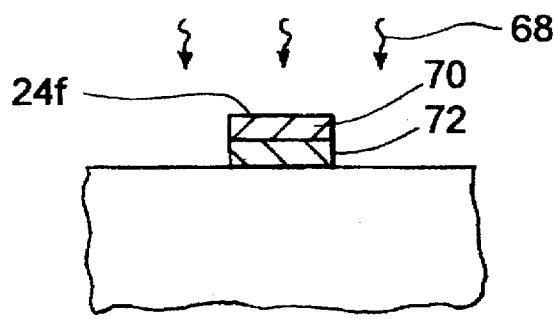
FIG. 6c is a processing step subsequent to that shown in FIG. 6b, wherein an upper portion of the single layer of refractory metal is converted to a nitride and a lower portion of the single layer of refractory metal is converted to a silicide to form a barrier-enhanced, refractory metal local interconnect.

FIGS. 6a–6c depict another alternative formation of local interconnect. Specifically, FIG. 6a illustrates deposition of refractory metal nitride, or deposition of metal followed by a nitride anneal. In either instance, an ensuing refractory metal nitride 62 is formed. Refractory metal nitride 62 preferably comprises titanium which is selectively patterned and removed, as shown in FIG. 6b. FIG. 6b depicts removal 64 and retainage 66 of layer 62. Removal and retainage of layer 62 is performed using conventional lithography techniques. FIG. 6c illustrates application of a thermal cycle 68 to the retained metal nitride material, causing a film of metal nitride 70 at the upper portion and metal silicide 72 at the lower portion. According to another embodiment, material 72 is polysilicon, and a metal silicide 70 is formed upon polysilicon 72. A metal oxide or nitride can be formed upon the metal silicide or metal nitride material 70. By varying the temperature and ambient gas during the anneal cycle, it is possible to obtain various metal nitride and metal silicide thickness combinations. Unmasked metal nitride is removed, as shown in FIG. 6b, preferably using a fluorine-based dry etch sequence. FIG. 6c depicts a finalized local interconnect 24f. It is understood that, contrary to photolithography patterning, material 66 can be formed through a damascene process. According to a damascene process, material 66 is inlaid into a trench within a dielectric. Thereafter, material is removed from the upper surface of the dielectric leaving only material within the trench. Removal is carried forth by either an etchback step or a chemical-mechanical polish (CMP) step.

Figure 7:
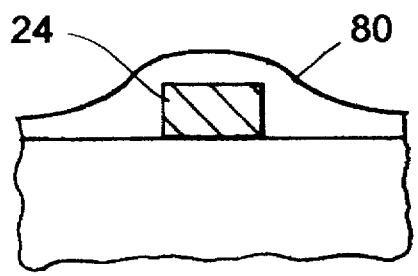
FIG. 7 is a processing step subsequent to either FIGS. 3, 4c, 5 or 6c , wherein a dielectric is deposited upon the local interconnect.

Given the various composition and processing sequences used to produce local interconnect 24 (shown in FIGS. 3–6c) a local interconnect is formed which, according to FIG. 2, is connected via contact 28 to VDD or VSS. A powered local interconnect 24 is shown in FIG. 7 along plane A of FIG. 2. Deposited upon local interconnect 24 is a dielectric 80. Dielectric 80 is preferably deposited using physical vapor deposition (PVD), chemical vapor deposition (CVD), plasma enhanced chemical vapor deposition (PECVD), or spin-on deposition techniques. In the former instance, a silane or TEOS source is used to produce dielectric 80 as it is being deposited upon and between local interconnect 24. In a latter instance, a liquid material of silicon (i.e., silicates, siloxanes, or silsesquioxanes) or TEOS is spin-on deposited and subsequently cured. In either instance, dielectric 80 contains sufficient insulative characteristics to isolate non-noise (steady state) signals from local interconnect 24. However, if sufficiently high transients occur; then capacitive coupling within dielectric 80 sinks the noise spikes of the signal to local interconnect 24.

Figure 8:
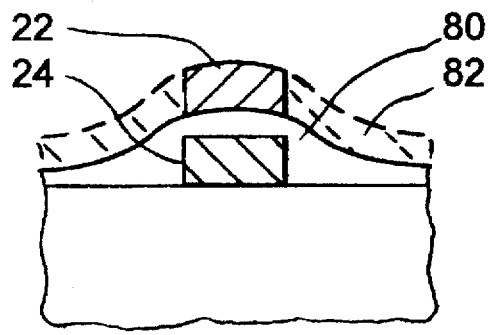
FIG. 8 is a processing step subsequent to FIG. 7, wherein a global interconnect (metal conductor) is patterned directly above at least a portion of the dielectric-covered local interconnect.

FIG. 8 illustrates a processing step subsequent to FIG. 7, wherein a metal conductor 22 is formed by selectively removing a conductive layer of metal 82. Conductive metal 82 comprises aluminum or other metals, and metal conductor 22 is formed using well-known lithography techniques. The thickness of dielectric 80 between conductor 22 and local interconnect 24 is sufficient to allow coupling of noise spikes but disallow coupling of non-noise signals.

It would be appreciated to those skilled in the art having the benefit of this disclosure that this invention is capable of applications with numerous types of MOS-processed circuits. Furthermore, it is to be understood that form of the invention shown and described is to be taken as presently preferred embodiments. Various modifications and changes may be made to each and every processing step as will be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An integrated circuit, comprising:
    a semiconductor substrate having a first dielectric placed upon the semiconductor substrate;
    a local interconnect having higher resistivity than aluminum formed upon the first dielectric;
    a power supply coupled to the local interconnect;
    a single layer second dielectric placed upon the local interconnect; and
    a metal conductor formed upon the single layer second dielectric directly above the local interconnect, except for a portion of said local interconnect to which said power supply is routed through said single layer second dielectric to said portion.

2. The integrated circuit as recited in claim 1, wherein said local interconnect comprises a local lateral geometry, and wherein the metal conductor comprises a conductor lateral geometry less than the local lateral geometry.

3. The integrated circuit as recited in claim 1, wherein said semiconductor substrate comprises a plurality of active areas spaced from each other.

4. The integrated circuit as recited in claim 1, wherein said semiconductor substrate comprises a plurality of field areas spaced from each other.

5. The integrated circuit as recited in claim 1, wherein said local interconnect comprises polysilicon.

6. The integrated circuit as recited in claim 1, wherein said local interconnect comprises doped polysilicon.

7. The integrated circuit as recited in claim 1, wherein said local interconnect comprises refractory metal.

8. The integrated circuit as recited in claim 1, wherein said local interconnect comprises metal silicide.

9. The integrated circuit as recited in claim 1, wherein said local interconnect comprises metal silicide and doped polysilicon.

10. The integrated circuit as recited in claim 1, wherein said power supply comprises a positive voltage or ground.

11. The integrated circuit as recited in claim 1, wherein said metal conductor comprises aluminum.

12. An interconnect structure, comprising:
    a local interconnect of a first conductivity placed across a local area of a semiconductor topography;
    a single layer of dielectric placed upon the local interconnect;
    a metal conductor of a second conductivity greater than said first conductivity placed upon said single layer of dielectric directly above the local interconnect, wherein the metal conductor occupies a conductor lateral area less than the local area, and wherein a portion of said local area which exceeds said conductor lateral area is occupied by a contact from a power supply conductor extending through said single layer dielectric to said portion; and
    a power supply coupled to said local interconnect.

13. The interconnect structure as recited in claim 12, wherein said semiconductor topography comprises a dielectric-covered silicon substrate.

14. The interconnect structure as recited in claim 12, wherein said local interconnect comprises polysilicon.

15. The interconnect structure as recited in claim 12, wherein said local interconnect comprises doped polysilicon.

16. The interconnect structure as recited in claim 12, wherein said local interconnect comprises refractory metal.

17. The interconnect structure as recited in claim 12, wherein said local interconnect comprises silicide.

18. The interconnect structure as recited in claim 12, wherein said local interconnect comprises metal silicide and doped polysilicon.

19. The interconnect structure as recited in claim 12, wherein said power supply comprises a politive voltage or ground.

20. The interconnect structure as recited in claim 12, wherein said metal conductor comprises aluminum.

* * * * *

UNITED STATES PATENT AND TRADEMARK OFFICE
CERTIFICATE OF CORRECTION

PATENT NO. : 5,717,242

DATED : February 10, 1998

INVENTOR(S) : Mark W. Michael, et al

It is certified that error appears in the above-identified patent and that said Letters Patent is hereby corrected as shown below:

On the title page item [54], and column 1, lines 1-3,

Title should read: "Integrated Circuit Having Local Interconnect For Reducing Signal Cross Coupled Noise".

Signed and Sealed this

Twenty-eighth Day of April, 1998

Attest:

BRUCE LEHMAN

Attesting Officer

Commissioner of Patents and Trademarks